United States Patent
Awaji

(10) Patent No.: US 10,276,462 B2
(45) Date of Patent: Apr. 30, 2019

(54) LID, AND OPTICAL DEVICE PACKAGE

(71) Applicant: FUJIKURA LTD., Tokyo (JP)

(72) Inventor: Daisuke Awaji, Chiba (JP)

(73) Assignee: FUJIKURA LTD., Tokyo (JP)

( * ) Notice: Subject to any disclaimer, the term of this patent is extended or adjusted under 35 U.S.C. 154(b) by 11 days.

(21) Appl. No.: 15/555,000

(22) PCT Filed: Dec. 16, 2016

(86) PCT No.: PCT/JP2016/087575
§ 371 (c)(1),
(2) Date: Aug. 31, 2017

(87) PCT Pub. No.: WO2017/175422
PCT Pub. Date: Oct. 12, 2017

(65) Prior Publication Data
US 2018/0108581 A1 Apr. 19, 2018

(30) Foreign Application Priority Data
Apr. 4, 2016 (JP) .................................. 2016-075147

(51) Int. Cl.
G02B 5/00 (2006.01)
G02B 7/00 (2006.01)
G02B 27/00 (2006.01)
B65D 1/02 (2006.01)
B65D 1/42 (2006.01)
H01L 23/02 (2006.01)
H01L 23/08 (2006.01)
G02F 1/1333 (2006.01)
G02F 1/1362 (2006.01)

(52) U.S. Cl.
CPC ............... H01L 23/08 (2013.01); B65D 1/02 (2013.01); B65D 1/42 (2013.01); G02B 7/00 (2013.01); G02B 7/008 (2013.01); G02F 1/1333 (2013.01); G02F 1/133308 (2013.01); H01L 23/02 (2013.01); G02F 1/136277 (2013.01); G02F 2001/133311 (2013.01)

(58) Field of Classification Search
CPC ....... H01L 2924/00; H01L 2224/45144; H01L 2224/48091; Y10T 29/49826; B64D 25/00; B64D 43/00; B64D 2045/009; G02B 5/005; G02B 7/00
USPC ............... 359/894, 237–240, 242, 245–246, 359/250–252, 265–271, 290–298; 349/38–40
See application file for complete search history.

(56) References Cited

FOREIGN PATENT DOCUMENTS

| JP | 2003-249101 A | 9/2003 |
| JP | 2014-150099 A | 8/2014 |
| WO | 2008/132997 A1 | 11/2008 |

Primary Examiner — William R Alexander
Assistant Examiner — Tamara Y. Washington
(74) Attorney, Agent, or Firm — Osha Liang LLP

(57) ABSTRACT

A lid constitutes, together with a housing, a package that encloses an optical element. The lid includes a frame plate divided into a first member and a second member; and a window plate that closes an opening of the frame plate. The window plate includes a lower surface whose outer peripheral part is bonded to the first member and an upper surface whose outer peripheral part is bonded to the second member.

11 Claims, 3 Drawing Sheets

LID, AND OPTICAL DEVICE PACKAGE

TECHNICAL FIELD

The present invention relates to a lid which closes a housing that houses an optical element. The present invention also relates to an optical device package which includes (i) an optical element, (ii) a housing which houses the optical element, and (iii) a lid which closes the housing.

BACKGROUND ART

Optical elements such as a liquid crystal on silicon (LCOS) element are in widespread use. These optical elements are used in a hermetically-sealed state so that properties of the optical elements will not be affected by humidity. Each of the optical elements is hermetically sealed with (i) a housing which houses the optical element and (ii) a lid which closes the housing.

FIG. 6 is an exploded perspective view illustrating a conventionally typical optical device package 100. The optical device package 100 includes (i) an optical element 110, (ii) a housing 120 which houses the optical element 110, and (iii) a lid 130 which closes the housing 120 (see FIG. 6). FIG. 7 is a cross-sectional view illustrating the lid 130 included in the optical device package 100. The lid 130 includes (i) a frame plate 131 having an opening 131a and (ii) a window plate 132 which is a light-transmissive plate (see FIG. 7). The window plate 132 has a lower surface whose outer peripheral part is bonded, via a bonding layer 133, to an opening-surrounding part of an upper surface of the frame plate 131. After light emitted from the optical element 110 passes through the window plate 132, the light goes out of the optical device package 100. When light externally enters the optical device package 100, the light first passes through the window plate 132 and then enters the optical element 110.

Patent Literature 1 discloses a lid obtained by glass frit bonding of (i) a ceramic lid part which corresponds to the frame plate 131 and (ii) a glass window part which corresponds to the window plate 132.

CITATION LIST

Patent Literature

[Patent Literature 1]
Japanese Patent Application Publication, Tokukai, No. 2014-150099 (Publication Date: Aug. 21, 2014)

With the conventional lid 130, however, the window plate 132 warps while the lid 130 is being cooled. The frame plate 131 and the window plate 132 which constitute the lid 130 are bonded to each other with, for example, a solder, a low-melting glass or a glass frit. The lid 130 is thus produced in a high-temperature environment, and then cooled and subsequently used. The window plate 132 warps while the lid 130 is being cooled. The warp of the window plate 11 changes (i) an emission angle of light emitted from the optical device package 100 and (ii) an incident angle of light which enters the optical device package 100. This consequently causes the optical device package 100 to fail to achieve its optical performance as designed.

The reason why the window plate 132 of the conventional lid 130 warps while the lid 130 is being cooled is as follows. That is, the frame plate 131 and the window plate 132 each thermally shrink while the lid 130 is being cooled. The frame plate 131 is usually made of a material whose coefficient of linear expansion is larger than that of a material of the window plate 132 (in general, the frame plate 131 is made of metal, and the window plate 132 is made of glass). On this account, while the lid 130 is being cooled, the thermal shrinkage of the frame plate 11 causes stress toward a center to be applied to the outer peripheral part of the lower surface of the window plate 132. This warps the window plate 132 such that a center part of the window plate 132 bulges. Even if the frame plate 131 and the window plate 132 are made of kovar and kovar glass, respectively, whose coefficients of linear expansion are close to each other, such warp of the window plate 132 gives an unignorable influence on the performance of the optical device package 100.

SUMMARY OF INVENTION

One or more embodiments of the present invention provide a lid whose window plate is less likely to warp while the lid is being cooled, and to provide, with the lid, an optical device package having a high optical performance (capable of achieving an optical performance as designed).

A lid of one or more embodiments of the present invention closes a housing that houses an optical element, the lid including: a frame plate divided into a first member and a second member; and a window plate which closes an opening of the frame plate, the window plate having (i) a lower surface whose outer peripheral part is bonded to the first member and (ii) an upper surface whose outer peripheral part is bonded to the second member.

One or more embodiments of the present invention make it possible to provide a lid whose window plate is less likely to warp while the lid is being cooled.

DETAILED DESCRIPTION OF EMBODIMENTS

The following description will discuss a lid in accordance with embodiments of the present invention with reference to the drawings. Note that the lid which will be described below constitutes an optical device package together with an optical element and a housing. In this optical device package, the housing functions as a container which houses the optical element, and the lid functions as a cover which closes the housing. Examples of the optical element which is to be enclosed in the optical device package include (i) reflective elements such as a liquid crystal on silicon (LCOS) element and a micro electro mechanical systems (MEMS) element, (ii) light-receiving elements such as a complementary MOS (CMOS) element and a photo diode (PD), and (iii) light-emitting elements such as a laser diode (LD) and a light emitting diode (LED). In the following description, the term "light" means light which enters the optical element or light which exits from the optical element.

[First Embodiment]

Figure 1:
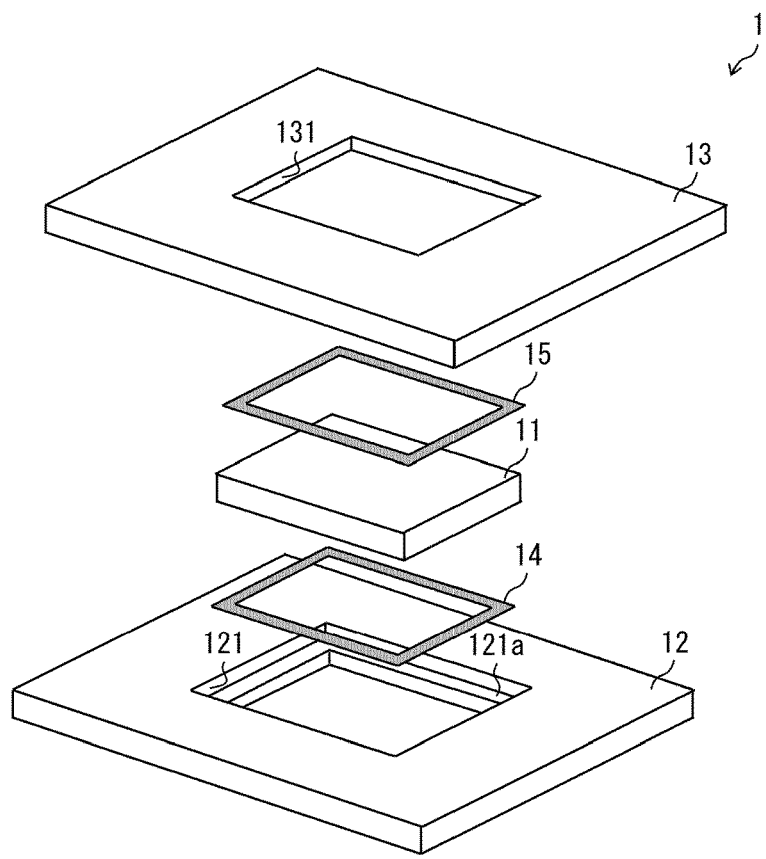
FIG. 1 is an exploded perspective view illustrating a lid in accordance with a first embodiment of the present invention.
Figure 2:
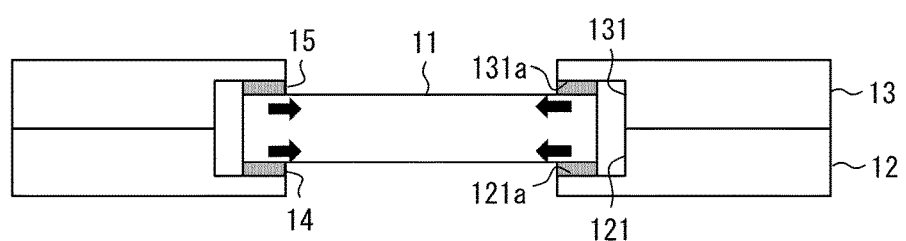
FIG. 2 is a cross-sectional view of the lid illustrated in FIG. 1.

The following discusses a lid 1 in accordance with a first embodiment of the present invention, with reference to FIGS. 1 and 2. FIG. 1 is an exploded perspective view illustrating the lid 1. FIG. 2 is a cross-sectional view illustrating the lid 1.

The lid 1 includes (i) a window plate 11, and (ii) a frame plate which is divided into a lower frame plate 12 (corresponding to a "first member" in Claims) and an upper frame plate 13 (corresponding to a "second member" in Claims). In the lid 1, the window plate 11 is sandwiched between the lower frame plate 12 and the upper frame plate 13.

The window plate 11 is a plate-like member which transmits light. In the first embodiment, the window plate 11 is a plate-like kovar glass member which has a rectangular shape in a plan view.

The lower frame plate 12 is a plate-like member which supports the window plate 11 on a lower surface side of the window plate 11. In the first embodiment, the lower frame plate 12 is a plate-like kovar member which has a rectangular shape in a plan view.

The lower frame plate 12 has, in its center, a double-stage opening 121 provided with an upper-stage opening larger in size than a lower-stage opening of the double-stage opening 121. The size of the upper-stage opening of the double-stage opening 121 is set so as to be larger than a size of the window plate 11, and the size of the lower-stage opening of the double-stage opening 121 is set so as to be smaller than the size of the window plate 11. The window plate 11, therefore, is put in the double-stage opening 121 from an upper surface side of the lower frame plate 12, so that an outer peripheral part of a lower surface of the window plate 11 faces an inner peripheral part of a tread surface 121a of the double-stage opening 121. The outer peripheral part of the lower surface of the window plate 11 is bonded, via a bonding layer 14, to the inner peripheral part of the tread surface 121a of the double-stage opening 121.

The bonding layer 14 is provided, in the shape of a closed ring, all over the outer peripheral part of the lower surface of the window plate 11. This makes it possible to realize hermetic sealing of a package constituted by the lid 1 and a housing. The bonding layer 14 can be made of a solder or a low-melting glass. Note, however, that in the first embodiment, the bonding layer 14 is assumed to be made of a solder.

The upper frame plate 13 is a plate-like member which supports the window plate 11 on an upper surface side of the window plate 11. In the first embodiment, the upper frame plate 13 is a plate-like member which is (i) the same in material as the lower frame plate 12 and (ii) the same in shape and size as the lower frame plate 12.

The upper frame plate 13 has, in its center, a double-stage opening 131 provided with a lower-stage opening larger in size than an upper-stage opening of the double-stage opening 131. The size of the lower-stage opening of the double-stage opening 131 is set so as to be larger than the size of the window plate 11, and the size of the upper-stage opening of the double-stage opening 131 is set so as to be smaller than the size of the window plate 11. The window plate 11, therefore, is put in the double-stage opening 131 from a lower surface side of the upper frame plate 13, so that an outer peripheral part of an upper surface of the window plate 11 faces an inner peripheral part of a tread surface 131a of the double-stage opening 131. The outer peripheral part of the upper surface of the window plate 11 is bonded, via a bonding layer 15, to the inner peripheral part of the tread surface 131a of the double-stage opening 131.

The bonding layer 15 is provided, in the shape of a closed ring, all over the outer peripheral part of the lower surface of the window plate 11. This makes it possible to keep hermeticity of the package constituted by the lid 1 and the housing even in a case where the bonding layer 14 cracks. In the first embodiment, the bonding layer 15 is a bonding layer which is (i) the same in material as the bonding layer 14 and (ii) the same in shape and size as the bonding layer 14.

Note that since the lower frame plate 12 and the upper frame plate 13 are bonded to the window plate 11 and are thereby connected to each other, an upper surface of the lower frame plate 12 and a lower surface of the upper frame plate 13 do not need to be bonded to each other or do not need to put in contact with each other. Even in this case, the hermeticity of the package is kept by the bonding layers 14 and 15.

Figure 7:
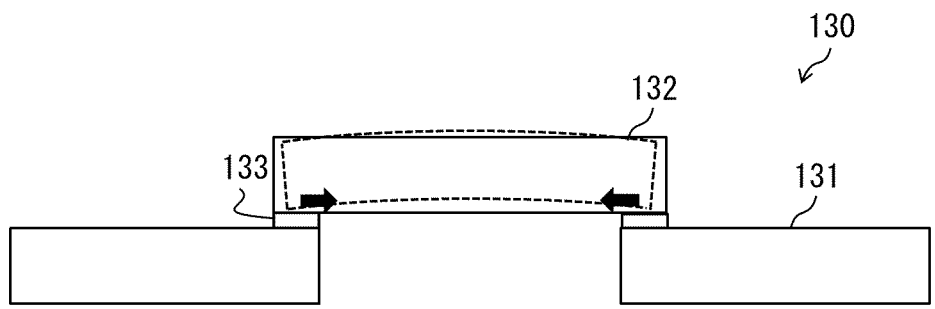
FIG. 7 is a cross-sectional view of a lid included in the optical device package illustrated in FIG. 6.

As described above, the lower surface of the window plate 11 is bonded to the lower frame plate 12 via the bonding layer 14, and the upper surface of the window plate 11 is bonded to the upper frame plate 13 via the bonding layer 15. Accordingly, whenever thermal shrinkage of the lower frame plate 12 causes stress toward a center to be applied to the outer peripheral part of the lower surface of the window plate 11, thermal shrinkage of the upper frame plate 13 causes stress toward the center to be applied to the outer peripheral part of the upper surface of the window plate 11 (see FIG. 2). The window plate 11 is thus less likely to warp, as compared to a conventional lid 130 in which stress toward a center is applied to only a lower surface of a window plate 132 (see FIG. 7).

In particular, the first embodiment employs (i) the upper frame plate 13 which is the same in material and shape as the lower frame plate 12 and (ii) the bonding layer 15 which is the same in material and shape as the bonding layer 14. This allows distribution of the stress applied to the lower surface of the window plate 11 to be symmetrical to that of the stress applied to the upper surface of the window plate 11. Consequently, the window plate 11 hardly warps.

Note that the lid 1 can be produced by carrying out the following steps.

Step 1: Place the lower frame plate 12 on a stage in a reflow furnace.

Step 2: Place, on the inner peripheral part of the tread surface 121a of the lower frame plate 12, a ring-like solder pattern A which is the material of the bonding layer 14. Alternatively, a solder cream which is the material of the bonding layer can be applied in a ring-like form onto the inner peripheral part of the tread surface 121a or onto the outer peripheral part of the lower surface of the window plate 11.

Step 3: Place the window plate 11 on the lower frame plate 12 so that the outer peripheral part of the lower surface of the window plate 11 comes into contact with the solder pattern A.

Step 4: Place, on the outer peripheral part of the upper surface of the window plate 11, a ring-like solder pattern B which is the material of the bonding layer 15. Alternatively, a solder cream which is the material of the bonding layer 15 can be applied in a ring-like form onto the outer peripheral part of the upper surface of the window plate 11 or onto the inner peripheral part of the tread surface 131a of the upper frame plate 13.

Step 5: Place the upper frame plate 13 on the window plate 11 so that the inner peripheral part of the tread surface 131a of the upper frame plate 13 comes into contact with the solder pattern B.

Step 6: Increase a temperature of the reflow furnace by hot air or infrared rays until the solder patterns A and B melt.

Step 7: Decrease the temperature of the reflow furnace by natural cooling until the solder patterns A and B solidify. This allows each of the lower frame plate 12 and the upper frame plate 13 to be bonded to the window plate 11, so that the lid 1 is completed.

Note that the first embodiment employs a configuration in which (i) the bonding layer 14 is in contact with only the lower surface of the window plate 11 and the tread surface 121a of the lower frame plate 12 and (ii) the bonding layer 15 is in contact with only the upper surface of the window plate 11 and the tread surface 131a of the upper frame plate 13. Note, however, that the present invention is not limited to this configuration. That is, a configuration illustrated in FIG. 3 can alternatively be employed. In the configuration illustrated in FIG. 3, (I) the bonding layer 14 is in contact with the lower surface of and a side surface of the window plate 11, and the tread surface 121a of and a riser surface 121b of the lower frame plate 12, and (II) the bonding layer 15 is in contact with the upper surface of and the side surface of the window plate 11, and the tread surface 131a of and a riser surface 131b of the upper frame plate 13.

Figure 3:
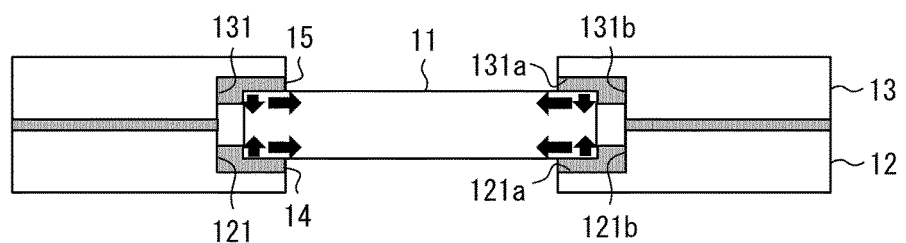
FIG. 3 is a cross-sectional view of a modification of the lid illustrated in FIG. 1.

In a case where the latter configuration is employed, a downward stress is applied to an upper part of the side surface of the window plate 11. This downward stress cancels an upward stress applied to a lower part of the side surface of the window plate 11 in a case where the upper surface of the lower frame plate 12 and the lower surface of the upper frame plate 13 are bonded to each other as illustrated in FIG. 3.

[Second Embodiment]

Figure 4:
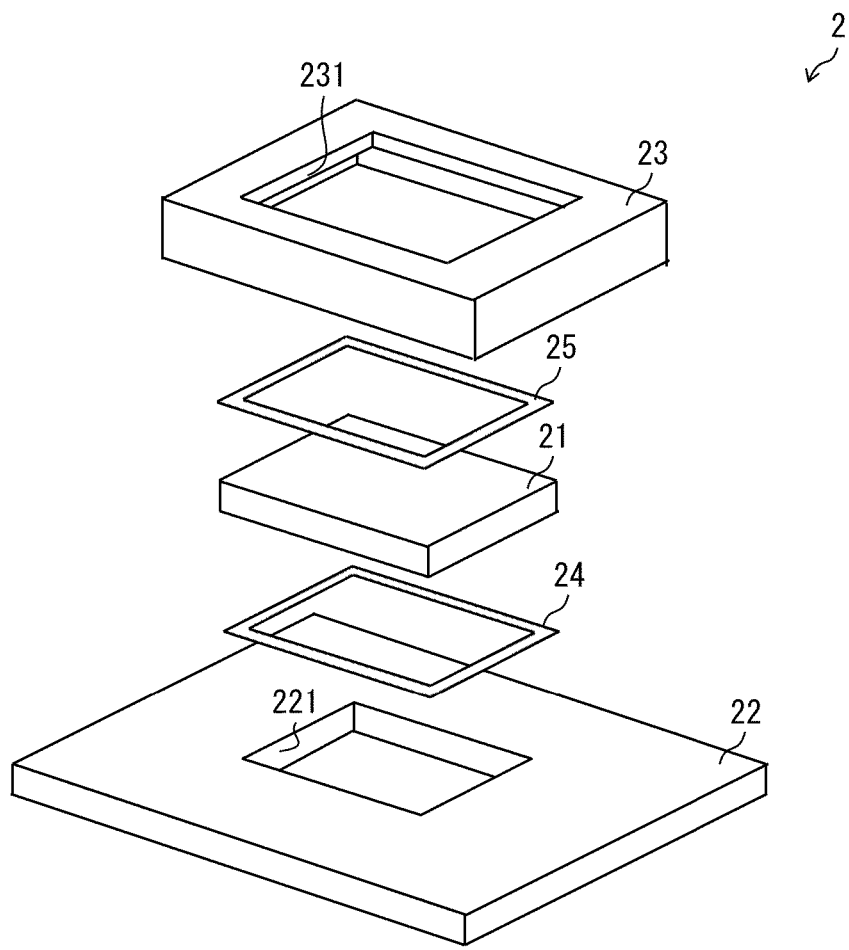
FIG. 4 is an exploded perspective view illustrating a lid in accordance with a second embodiment of the present invention.
Figure 5:
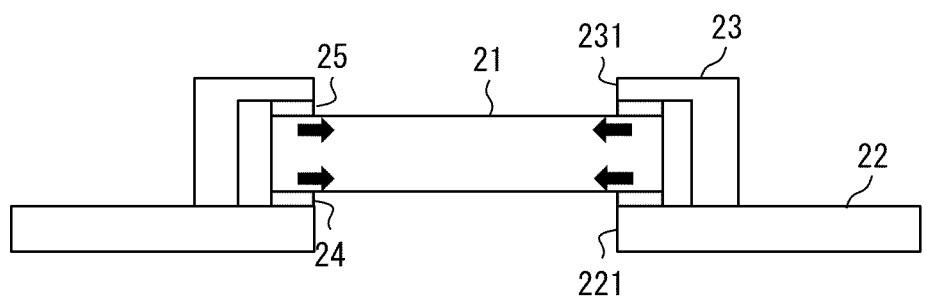
FIG. 5 is a cross-sectional view of the lid illustrated in FIG. 4.
Figure 6:
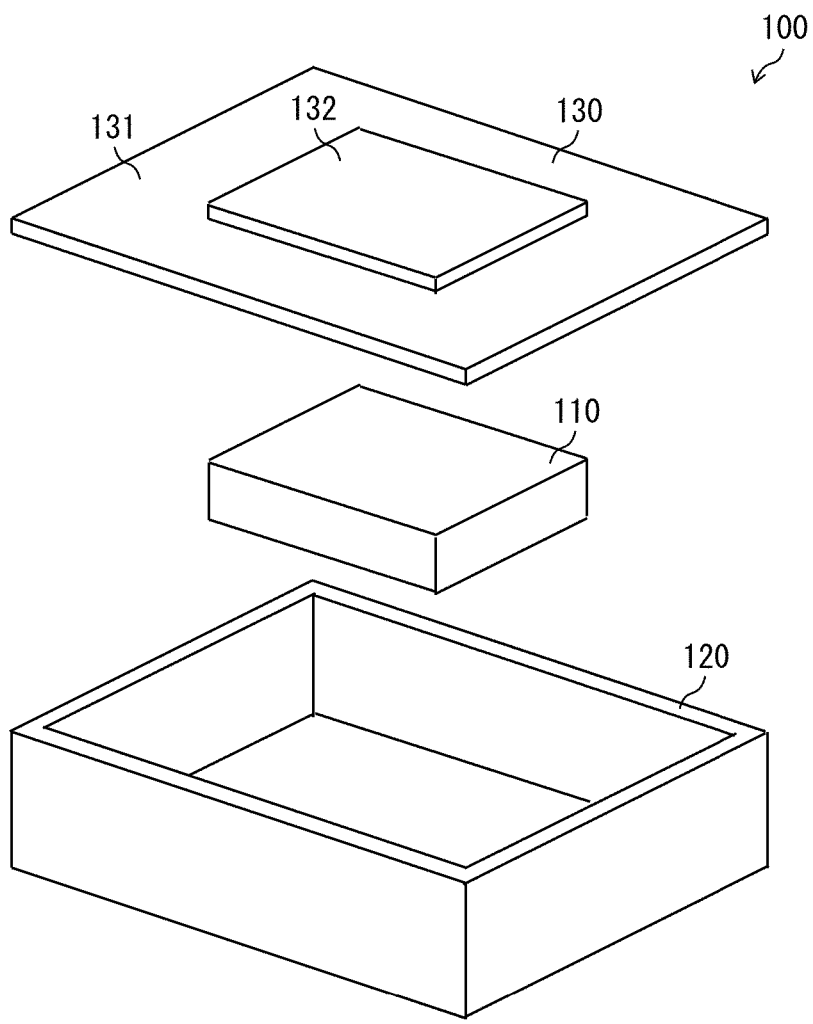
FIG. 6 is an exploded perspective view illustrating a conventional optical device package.

The following description will discuss a lid 2 in accordance with a second embodiment of the present invention, with reference to FIGS. 4 and 5. FIG. 4 is an exploded perspective view illustrating the lid 2. FIG. 5 is a cross-sectional view illustrating the lid 2.

The lid 2 includes (i) a window plate 21, and (ii) a frame plate divided into a base 22 (corresponding to the "first member" in Claims) and a cover 23 (corresponding to the "second member" in Claims). In the lid 2, the window plate 21 is provided on the base 22 and covered by the cover 23.

The window plate 21 is a plate-like member which transmits light. In the second embodiment, the window plate is a plate-like kovar glass member which has a rectangular shape in a plan view.

The base 22 is a plate-like member which supports the window plate 21 on a lower surface side of the window plate 21. In the second embodiment, the base 22 is a plate-like kovar member which has a rectangular shape in a plan view.

The base 22 has an opening 221 in its center. The opening 221 has a size which is set so as to be smaller than that of the window plate 21. This allows an outer peripheral part of a lower surface of the window plate 21 to face an opening-surrounding part of an upper surface of the base 22. The outer peripheral part of the lower surface of the window plate 21 is bonded, via a bonding layer 24, to the opening-surrounding part of the upper surface of the base 22.

The bonding layer 24 is provided, in the shape of a closed ring, all over the outer peripheral part of the lower surface of the window plate 21. This makes it possible to realize hermetic sealing of a package constituted by the lid 2 and a housing. The bonding layer 24 can be made of a solder or a low-melting glass. Note, however, that in the second embodiment, the bonding layer 24 is assumed to be made of a solder.

The cover 23 is a box-like member which supports the window plate 21 on an upper surface side of the window plate 21. In the second embodiment, the cover 23 is a box-like member which (i) is the same in material as the base 22 and (ii) has a rectangular bottom surface which is smaller than the upper surface of the base 22.

A base plate serving as a bottom portion of the box-like shape of the cover 23 has an opening 231. A size of the opening 231 is set so as to be smaller than that of the window plate 21. This allows an outer peripheral part of an upper surface of the window plate 21 to face an opening-surrounding part of the base plate of the cover 23. The outer peripheral part of the upper surface of the window plate 21 is bonded, via a bonding layer 25, to the opening-surrounding part of the base plate of the cover 23.

The bonding layer 25 is provided, in the shape of a closed ring, all over the outer peripheral part of the lower surface of the window plate 21. This makes it possible to keep hermeticity of the package constituted by the lid 2 and the housing even if the bonding layer 24 cracks.

Note that since the base 22 and the cover 23 are bonded to the window plate 21 and are thereby connected to each other, the upper surface of the base 22 and an end surface of a side wall of the cover 23 do not need to be bonded to each other or do not need to put in contact with each other. Even in this case, the hermeticity of the package is kept by the bonding layers 24 and 25.

As described above, the lower surface of the window plate 21 is bonded to the base 22 via the bonding layer 24, and the upper surface of the window plate 21 is bonded to the cover 23 via the bonding layer 25. Accordingly, whenever thermal shrinkage of the base 22 causes stress toward a center to be applied to the outer peripheral part of the lower surface of the window plate 21, thermal shrinkage of the cover 23 causes stress toward the center to be applied to the outer peripheral part of the upper surface of the window plate 21 (see FIG. 5). The window plate 21 thus less warps, as compared to the conventional lid 130 in which the stress toward the center is applied to only the lower surface of the window plate 132 (see FIG. 7).

In particular, the second embodiment employs (i) the cover 23 which is the same in material as the base 22 and (ii) the bonding layer 25 which is the same in material and shape as the bonding layer 24. This allows distribution of the stress applied to the lower surface of the window plate 21 to be substantially symmetrical to that of the stress applied to the upper surface of the window plate 21. Consequently, the window plate 21 hardly warps.

SUMMARY

A lid a lid according to one or more embodiments closes a housing that houses an optical element, the lid including: a frame plate divided into a first member and a second member; and a window plate which closes an opening of the frame plate, the window plate having (i) a lower surface whose outer peripheral part is bonded to the first member and (ii) an upper surface whose outer peripheral part is bonded to the second member.

According to one or more embodiments, whenever thermal shrinkage of the first member causes stress toward a center to be applied to the outer peripheral part of the lower surface of the window plate, thermal shrinkage of the second member causes stress toward the center to be applied to the outer peripheral part of the upper surface of the window plate. The window plate is thus less likely to warp, as compared to a conventional lid in which stress toward a center is applied to only a lower surface of a window plate.

The lid of one or more embodiments may be configured such that: the second member is the same in material as the first member; and the second member is the same in shape and size as the first member.

The configuration allows distribution of the stress applied to the outer peripheral part of the lower surface of the window plate to be more precisely symmetrical to that of the stress applied to the outer peripheral part of the upper surface of the window plate. Consequently, the window plate less warps.

The lid of one or more embodiments may be configured such that: the outer peripheral part of the lower surface of the window plate is bonded to the first member via a first bonding layer; the outer peripheral part of the upper surface of the window plate is bonded to the second member via a second bonding layer; the second bonding layer is the same in material as the first bonding layer; and the second bonding layer is the same in shape and size as the first bonding layer.

The configuration allows the distribution of the stress applied to the outer peripheral part of the lower surface of the window plate to be symmetrical to that of the stress applied to the outer peripheral part of the upper surface of the window plate. Consequently, the window plate never warps.

The lid of one or more embodiments may be configured such that: the first member is a plate-like member which has a first double-stage opening provided with (i) a lower-stage opening smaller in size than the window plate and (ii) an upper-stage opening larger in size than the window plate, the window plate having a lower part which is put in the upper-stage opening of the first double-stage opening; the second member is a plate-like member which has a second double-stage opening provided with (i) an upper-stage opening smaller in size than the window plate and (ii) a lower-stage opening larger in size than the window plate, the window plate having an upper part which is put in the lower-stage opening of the second double-stage opening; the outer peripheral part of the lower surface of the window plate is bonded to an inner peripheral part of a tread surface of the first double-stage opening; and the outer peripheral part of the upper surface of the window plate is bonded to an inner peripheral part of a tread surface of the second double-stage opening.

According to the configuration, the window plate is accommodated in a cavity created by the upper-stage opening of the first double-stage opening and the lower-stage opening of the second double-stage opening. This allows a thickness of the lid to be smaller than a sum of a thickness of the first member, a thickness of the second member, and a thickness of the window plate (for example, to be equal to a sum of the thickness of the first member and the thickness of the second member). It is therefore possible to provide a thin lid whose window plate less or never warps.

The lid of one or more embodiments may be configured such that: the first member is a plate-like member having an opening; the second member is a box-like member which has an opening provided in a base plate serving as a bottom of a box-like shape, the second member covering the window plate which is provided on an upper surface of the first member; the outer peripheral part of the lower surface of the window plate is bonded to an opening-surrounding part of the upper surface of the first member; and the outer peripheral part of the upper surface of the window plate is bonded to an opening-surrounding part of the base plate of the second member.

In the above configuration, when a thickness of a part where the second member is provided is put aside, the thickness of the lid is equal to the thickness of the first member. It is therefore possible to provide a thin lid whose window plate less or never warps.

Note that the scope of the present invention encompasses a high-optical-performance optical device package (capable of achieving a designed optical performance) which is provided by inclusion of the lid of one or more embodiments.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1: Lid
11: Window plate
12: Lower frame plate (first member)
121: Double-stage opening (first double-stage opening)
121a: Tread surface
13: Upper frame plate (second member)
131: Double-stage opening (second double-stage opening)
131a: Tread surface
14: Bonding layer (first bonding layer)
15: Bonding layer (second bonding layer)
2: Lid
21: Window plate
22: Base (first member)
221: Opening (first opening)
23: Cover (second member)
231: Opening (second opening)
24: Bonding layer (first bonding layer)
25: Bonding layer (second bonding layer)

The invention claimed is:

1. A lid that constitutes, together with a housing, a package that encloses an optical element, the lid comprising:
   a frame plate divided into a first member and a second member; and
   a window plate that closes an opening of the frame plate, wherein
   the window plate comprises (i) a lower surface that faces the optical element and whose outer peripheral part is bonded to the first member and (ii) an upper surface that faces away from the optical element and whose outer peripheral part is bonded to the second member.

2. The lid as set forth in claim 1, wherein:
   the second member is same in material as the first member; and
   the second member is same in shape and size as the first member.

3. The lid as set forth in claim 2, wherein:
   the outer peripheral part of the lower surface of the window plate is bonded to the first member via a first bonding layer;
   the outer peripheral part of the upper surface of the window plate is bonded to the second member via a second bonding layer;
   the second bonding layer is same in material as the first bonding layer; and the second bonding layer is same in shape and size as the first bonding layer.

4. The lid as set forth in claim 2, wherein:
the first member is a plate-like member comprising a first double-stage opening provided with (i) a lower-stage opening smaller in size than the window plate and (ii) an upper-stage opening larger in size than the window plate,
the window plate comprises a lower part that is put in the upper-stage opening of the first double-stage opening;
the second member is a plate-like member comprising a second double-stage opening provided with (i) an upper-stage opening smaller in size than the window plate and (ii) a lower-stage opening larger in size than the window plate,
the window plate comprises an upper part that is put in the lower-stage opening of the second double-stage opening;
the outer peripheral part of the lower surface of the window plate is bonded to an inner peripheral part of a tread surface of the first double-stage opening; and
the outer peripheral part of the upper surface of the window plate is bonded to an inner peripheral part of a tread surface of the second double-stage opening.

5. The lid as set forth in claim 1, wherein:
the first member is a plate-like member comprising an opening;
the second member is a box-like member comprising an opening provided in a base plate serving as a bottom of a box-like shape,
the second member covers the window plate that is provided on an upper surface of the first member;
the outer peripheral part of the lower surface of the window plate is bonded to an opening-surrounding part of the upper surface of the first member; and
the outer peripheral part of the upper surface of the window plate is bonded to an opening-surrounding part of the base plate of the second member.

6. An optical device package, comprising the lid as set forth in claim 1.

7. The lid as set forth in claim 1, wherein the first member and the second member are mechanically separable.

8. The lid as set forth in claim 3, wherein the first bonding layer and the second bonding layer are each in the shape of a closed ring.

9. A lid that constitutes, together with a housing, a package that encloses an optical element, the lid comprising:

a frame plate divided into a first member and a second member; and
a window plate that closes an opening of the frame plate,
wherein the window plate comprises (i) a lower surface whose outer peripheral part is bonded to the first member and (ii) an upper surface whose outer peripheral part is bonded to the second member,
wherein the second member is same in material as the first member,
wherein the second member is same in shape and size as the first member,
wherein the first member is a plate-like member comprising a first double-stage opening provided with (i) a lower-stage opening smaller in size than the window plate and (ii) an upper-stage opening larger in size than the window plate,
the window plate comprises a lower part that is put in the upper-stage opening of the first double-stage opening,
wherein the second member is a plate-like member comprising a second double-stage opening provided with (i) an upper-stage opening smaller in size than the window plate and (ii) a lower-stage opening larger in size than the window plate,
the window plate comprises an upper part that is put in the lower-stage opening of the second double-stage opening,
wherein the outer peripheral part of the lower surface of the window plate is bonded to an inner peripheral part of a tread surface of the first double-stage opening, and
wherein the outer peripheral part of the upper surface of the window plate is bonded to an inner peripheral part of a tread surface of the second double-stage opening.

10. The lid as set forth in claim 9, wherein:
the outer peripheral part of the lower surface of the window plate is bonded to the first member via a first bonding layer,
the outer peripheral part of the upper surface of the window plate is bonded to the second member via a second bonding layer,
the second bonding layer is same in material as the first bonding layer, and
the second bonding layer is same in shape and size as the first bonding layer.

11. An optical device package, comprising the lid as set forth in claim 9.

* * * * *